(12) United States Patent  (10) Patent No.: US 8,507,370 B2
Pan  (45) Date of Patent: Aug. 13, 2013

(54) METHOD OF TRANSFERRING EPITAXIAL FILM

(75) Inventor: Eric Ting-Shan Pan, Fremont, CA (US)

(73) Assignee: Athenaeum LLC, Zephyr Cove, NV (US)

( * ) Notice: Subject to any disclaimer, the term of this patent is extended or adjusted under 35 U.S.C. 154(b) by 0 days.

(21) Appl. No.: 13/487,574

(22) Filed: Jun. 4, 2012

(65) Prior Publication Data

US 2012/0238079 A1  Sep. 20, 2012

Related U.S. Application Data

(60) Division of application No. 12/607,762, filed on Oct. 28, 2009, now Pat. No. 8,193,078, and a continuation-in-part of application No. 12/417,931, filed on Apr. 3, 2009, and a continuation-in-part of application No. 12/417,982, filed on Apr. 3, 2009, and a continuation-in-part of application No. 12/418,020, filed on Apr. 3, 2009, and a continuation-in-part of application No. 12/418,223, filed on Apr. 3, 2009.

(60) Provisional application No. 61/109,147, filed on Oct. 28, 2008.

(51) Int. Cl.
    *H01L 21/00* (2006.01)

(52) U.S. Cl.
    USPC ............. 438/500; 438/458; 257/E21.464

(58) Field of Classification Search
    USPC ............. 438/58, 497, 500; 257/E21.464, 257/E21.465
    See application file for complete search history.

(56) References Cited

U.S. PATENT DOCUMENTS

| | | | |
|---|---|---|---|
| 3,647,578 A | 3/1972 | Barnett et al. |
| 3,690,965 A | 9/1972 | Bergh et al. |
| 3,809,584 A | 5/1974 | Akai et al. |
| 4,026,240 A | 5/1977 | DeFevere |
| 4,186,045 A | 1/1980 | Gatos et al. |
| 4,298,410 A | 11/1981 | Nakajima et al. |
| 4,406,245 A | 9/1983 | Heinen |
| 4,464,211 A | 8/1984 | Logan et al. |
| 4,470,368 A | 9/1984 | Reynolds et al. |
| 4,522,661 A | 6/1985 | Morrison et al. |
| 4,768,463 A | 9/1988 | Yoshida et al. |
| 5,223,079 A | 6/1993 | Leung et al. |
| 5,326,716 A | 7/1994 | Bauser et al. |
| 5,391,236 A | 2/1995 | Krut et al. |
| 6,500,731 B1 | 12/2002 | Nakagawa et al. |
| 2004/0183090 A1 | 9/2004 | Kitaoka et al. |
| 2006/0073681 A1 | 4/2006 | Han |

OTHER PUBLICATIONS

Kochiya, T. et al., "Anisotropy of lateral growth rate in liquid phase epitaxy of InP and its association with kink-step structures on the surface," Applied Surface Science, 237, No. 1-4 (Oct. 15, 2004): 235-241.

Nikolaev, A. E. et al., "SiC liquid-phase epitaxy on patterned substrates," Journal of Crystal Growth, 166, No. 1-4 (Sep. 1, 1996): 607-611.

(Continued)

*Primary Examiner* — Cheung Lee
(74) *Attorney, Agent, or Firm* — J. Nicholas Gross

(57) ABSTRACT

A method of growing an epitaxial film and transferring it to an assembly substrate is disclosed. The film growth and transfer are made using an epitaxy lateral overgrowth technique. The formed epitaxial film on an assembly substrate can be further processed to form devices such as solar cell, light emitting diode, and other devices and assembled into higher integration of desired applications.

29 Claims, 14 Drawing Sheets

(56) References Cited

OTHER PUBLICATIONS

Sakai, S. et al., "Selective Lateral Growth Mechanism of GaAs by Liquid-Phase Electroepitaxy," Japanese Journal of Applied Physics, 33 (1994): 23-27, 5 pages.

Chung, K-W. et al., "Lateral growth of GaAs over W by selective liquid phase epitaxy," Applied Physics Letters, 52 (1988): 1716.

Dobosz, D. et al., "Epitaxial lateral overgrowth of semiconductor structures by liquid phase epitaxy" International Journal of Materials and Product Technology, 22, No. 1/2/3 (2005): 50-63.

Zytkiewicz, Z. R. et al., "Recent progress in lateral overgrowth of semiconductor structures from the liquid phase," Crystal Research and Technology, 40, No. 4-5, (2005): 321-328, 8 pages.

Wanlass, M. et al., "Monolithic, Ultra-Thin GaInP/GaAs/GaInAsTandem Solar Cells," NREL/PR-520-39852, Presented at the 2006 IEEE 4th World Conference on Photovoltaic Energy Conversion (WCPEC-4) held May 7-12, 2006 in Waikoloa, Hawaii.

Goorsky, M.S. et al., "Engineered Layer Transfer Substrates for Heterogeneous Integration of III-V Compound Semiconductors," 2008 The International Conference on Compound Semiconductor Manufacturing Technology.

Brendel, R., "Crystalline thin-film silicon solar cells from layer-transfer processes: a review," Proc. 10th Workshop on Crystalline Silicon Solar Cell Materials and Processes, Aug. 13-16, 2000, Copper Mountain, USA, 9 pages.

Voncken, M. M. A. J. et al., "Etching AlAs with HF for Epitaxial Lift-Off Applications," Journal of the Electrochemical Society, 151, No. 5 (2004): G347-G352.

Roelkens, G. et al., "Heterogeneous integration of III-V material and Silicon: fabrication and devices," Proceedings Symposium IEEE/LEOS Benelux Chapter, (2004): 83-86, 4 pages.

Jokerst, N.M. et al., "The Heterogeneous Integration of Optical Interconnections Into Integrated Microsystems," IEEE Journal of Selected Topics in Quantum Electronics, 9, No. 2, Mar./Apr. 2003, 11 pages.

Lee, X. Y. et al., "Thin Film GaAs Solar Cells on Glass Substrates by Epitaxial Liftoff," National renewable energy laboratory and sandia national laboratories photovoltaics program review meeting. AIP Conference Proceedings, 394, (1997): 719-727.

Archer, M.J. et al., "Materials Processes for Ultrahigh Efficiency Lattice Mismatched Multijunction Solar Cells," SPIE Optics+Photonics (2007): 6649-14, 22 pages.

Muller, P. et al., "Surface melting of nanoscopic epitaxial films," Surface Science, 529, No. 1-2, (2003): 59-94, 67 pages.

Danielle, J. J., "Peltier-induced LPE and composition stabilization of GaAlAs," Applied Physics Letters, 27, No. 7, (1975): 373.

Danielle, J. J. et al., "Electroepitaxial (peltier-induced) liquid phase epitaxy, compositional stabilization and x-ray analysis of thick (120 μm) $In_{1-x}Ga_xP$ Epilayers on (100) GaAs," Journal of Electronic Materials, 12, No. 6 (1983): 1015-1031.

Dobosz, D. et al., "Liquid phase growth and characterization of laterally overgrown GaSb epitaxial layers," Thin Solid Films, 412, (2002): 64.

Liu, Y.C. et al., "Computational analysis of lateral overgrowth of GaAs by liquid-phase epitaxy," Journal of Crystal Growth, 275, (2005): 953-957.

Zytkiewicz, Z. R., "Epitaxial Lateral Overgrowth of GaAs: Principle and Growth Mechanism," Crystal Research and Technology, 34, 5-6, (1999): 573-582, 10 pages.

METHOD OF TRANSFERRING EPITAXIAL FILM

RELATED APPLICATION DATA

The present application claims the benefit and is a divisional of application Ser. No. 12/607,762 (now U.S. Pat. No. 8,193,078), which in turn claims the benefit under 35 U.S.C. 119(e) of the priority date of Provisional Application Ser. No. 61/109,147 filed Oct. 28, 2008, both of which are hereby incorporated by reference. The application also claims priority to and is a continuation-in-part of Ser. Nos. 12/417,931; 12/417,982; 12/418,020 and 12/418,223 also incorporated by reference.

FIELD OF THE INVENTION

The present invention relates to epitaxial layer growth and transfer using liquid phase epitaxy and particularly to such systems/methods that provide one or more epitaxial layers that are stackable and connectable for integration in monolithic devices, chip scale packaging, and multi-component modules.

BACKGROUND

An epitaxial layer is the engine of compound semiconductor device where its composition, dopant concentration, homostructure or heterostructure, and thickness determine a device's electrical, thermal, mechanical, and/or optical characteristics. Because of special material properties, compound semiconductors are critical to the success of many technologies that have demonstrated widespread applications in defense, space, and commercial sectors. These applications and devices include but not limited to optoelectronics such as lasers, sensors, optical data storage, fiber optics, light emitting diodes (LED), and photovoltaics (PV), radio frequency (RF) and wireless systems, and microwave, millimeter-wave, radar, and satellite communication systems.

The prior art layer transfer methods separate grown epitaxy layer(s) or finished device structure from a parent wafer substrate to a daughter substrate. The prior art process typically is practiced as follows:

1) Deposit a backside contact and back surface reflector atop an inverted tandem structure which is grown on an etch stop layer over a first substrate. Mount the inverted tandem structure upside down on a second substrate. Remove the etch stop layer and thus the first substrate. Complete frontside processing of the tandem structure on the second substrate.
2) Deposit some layers on the first substrate, and other layers on the second substrate. Polish and bond the two-layered substrates by annealing. Detach the second substrate by a hydrogen implantation, leaving the desired layer combination on the first substrate.
3) Prepare a surface layer (surface conditioning) on a silicon substrate. Grow device layer on the surface treated layer. Attach a carrier to the device layer. Remove the surface layer and the silicon substrate.
4) Build a semiconductor device layer on a first substrate. Provide a set of first functional elements to connect in the semiconductor device layer. Attach a carrier substrate on top of the first functional elements. Remove the first substrate to expose the bottom side of the semiconductor device layer producing a first intermediate structure. Build a set of second functional elements on a foundation substrate to produce a second intermediate structure. Bond the first and the second intermediate structures to form a third intermediate structure. Remove the carrier substrate. Provide input output means on the exposed surface of the first functional elements to form the integrated device structure.
5) The epitaxial lift-off process allows the separation of a thin layer of compound semiconductor material from the substrate by strain-accelerated selective etching of an intermediate or sacrificial layer. Other means of removing the sacrificial layer in ELO include laser-assisted lift-off, ion bombardment.
6) Fabricate device on etch stop layer (epitaxial surface) grown on a substrate. Mesa etch to etch stop layer and pattern separate devices. Remove substrate using selective wet etching. Bond the device onto a host substrate using a transfer diaphragm.
7) Wax the top of the device. Lift-off in selective chemical etch of a sacrificial layer and removes the substrate. Attach the lift-off device to a glass substrate. Remove wax in chemical.
8) Implant the device template substrate. Activate and clean the surface of the device template substrate and the handle substrate. Initiate the bond at room temperature. Apply uniform pressure and heat to the stacked wafers to strengthen the bond and initiate exfoliation.

These are just typical steps of course and are simplified here for instructive purposes. Some background references for this technology are identified below:

T. Kochiyaa, et al., "Anisotropy of lateral growth rate in liquid phase epitaxy of InP and its association with kink-step structures on the surface," Applied Surface Science, 237, no. 1-4 (15 Oct. 2004): 235-241.

A. E. Nikolaev, et al., "SiC liquid-phase epitaxy on patterned substrates," Journal of Crystal Growth, 166, no. 1-4 (1 Sep. 1996): 607-611.

S. Sakai et al., "Selective Lateral Growth Mechanism of GaAs by Liquid-Phase Electroepitaxy," Japanese Journal of Applied Physics, 33 (1994): 23-27.

K-W. Chung et al., "Lateral growth of GaAs over W by selective liquid phase epitaxy," Applied Physics Letters, 52 (1988): 1716.

D. Dobosz et al., "Epitaxial lateral overgrowth of semiconductor structures by liquid phase epitaxy" International Journal of Materials and Product Technology, 22, no. 1/2/3 (2005): 50-63.

Z. R. Zytkiewicz et al., "Recent progress in lateral overgrowth of semiconductor structures from the liquid phase," Crystal Research and Technology, 40, no. 4-5, (2005): 321-328.

D. Dobosz et al., "Liquid phase growth and characterization of laterally overgrown GaSb epitaxial layers," Thin Solid Films, 412, (2002): 64.

Y. C. Liua et al., "Computational analysis of lateral overgrowth of GaAs by liquid-phase epitaxy," Journal of Crystal Growth, 275, (2005): 953-957.

Z. R. Zytkiewicz, "Epitaxial Lateral Overgrowth of GaAs: Principle and Growth Mechanism," Crystal Research and Technology, 34, 5-6, (1999): 573-582.

M. Wanlass et al., "Monolithic, Ultra-Thin GaInP/GaAs/GaInAsTandem Solar Cells," NREL/PR-520-39852, Presented at the 2006 IEEE 4th World Conference on Photovoltaic Energy Conversion (WCPEC-4) held May 7-12, 2006 in Waikoloa, Hi.

M. S. Goorsky et al., "Engineered Layer Transfer Substrates for Heterogeneous Integration of III-V Compound Semiconductors," 2008 The International Conference on Compound Semiconductor Manufacturing Technology.

R. Brendel, "Crystalline thin-film silicon solar cells from layer-transfer processes: a review," Proc. 10th Workshop on Crystalline Silicon Solar Cell Materials and Processes, Aug. 13-16, 2000, Copper Mountain, USA.

M. M. A. J. Voncken et al., "Etching AlAs with HF for Epitaxial Lift-Off Applications," Journal of the Electrochemical Society, 151, no 5 (2004): G347-G352.

G. Roelkens et al., "Heterogeneous integration of III-V material and Silicon: fabrication and devices," Proceedings Symposium IEEE/LEOS Benelux Chapter, (2004): 83-86.

N. M. Jokerst et al., "The Heterogeneous Integration of Optical Interconnections Into Integrated Microsystems," IEEE JOURNAL OF SELECTED TOPICS IN QUANTUM ELECTRONICS, 9, no. 2, MARCH/APRIL 2003.

X. Y. Lee et al., "Thin Film GaAs Solar Cells on Glass Substrates by Epitaxial Liftoff," National renewable energy laboratory and sandia national laboratories photovoltaics program review meeting. AIP Conference Proceedings, 394, (1997): 719-727.

M. J. Archer et al., "Materials Processes for Ultrahigh Efficiency Lattice Mismatched Multijunction Solar Cells," SPIE Optics+Photonics (2007): 6649-14.

P. Muller et al., "Surface melting of nanoscopic epitaxial films," Surface Science, 529, no. 1-2, (2003): 59-94.

J. J. Daniele, "Peltier-induced LPE and composition stabilization of GaAlAs," Applied Physics Letters, 27, no. 7, (1975): 373.

J. J. Daniele et al., "Electroepitaxial (peltier-induced) liquid phase epitaxy, compositional stabilization and x-ray analysis of thick (120 μm) In1-xGaxP EPILAYERS ON (100) GaAs," Journal of Electronic Materials, 12, no. 6 (1983): 1015-1031.

U.S. Pat. No. 4,464,211 Logan et al.
U.S. Pat. No. 4,470,368 Reynolds, Jr. et al.
U.S. Pat. No. 4,768,463 Yoshida et al.
U.S. Pat. No. 4,186,045 Gatos et al.
U.S. Pat. No. 5,391,236 Dmitri et al.

All of the above are incorporated by reference herein.

A number of fundamental barriers persist to mass production and commercialization of compound semiconductor devices namely: 1) material cost, 2) substrate size, and 3) component/sub-system integration. Despite the fact that the manufacturing cost of compound semiconductors has come down over time, it still remains much higher than silicon. Among the cost drivers, the cost of the crystalline substrate and epitaxial layer typically accounts for more than half of the finished wafer cost. Depending on the type of materials, crystal or substrate sizes also vary widely which raise challenges in tooling for wafer processing to make discrete devices or integrated circuits.

The other barrier is a lack of a technology platform (fabrication and integration platforms either monolithic or modular) versatile enough to intermix and integrate devices made from different materials for higher performance and/or functionality. Examples of needs for such an integration platform come from photonic integrated circuits in fiber optics, full spectrum utilization multijunction cells in photovoltaics, and transceiver in communication and radar systems.

Although epitaxy growth technologies have advanced with sophistications in equipment, epitaxy structure, and materials over the past decades, the manufacturing process of monolithically layering over crystalline substrate, wafer processing for device or integrated circuit (IC) formation, device/IC packaging, and board/module assembly has remained essentially the same.

Accordingly there is clearly a long-felt need for epitaxial systems and processes which are capable of addressing these deficiencies in the prior art.

SUMMARY OF THE INVENTION

An object of the present invention, therefore, is to overcome the aforementioned limitations of the prior art.

One aspect of the present invention concerns an assembly substrate that can be used to form a desired structure for an epitaxial layer;

Another aspect of the invention concerns an epitaxial structure that includes an assembly substrate and an integrated epitaxial thin film layer;

A further aspect of the invention concerns epitaxial layers and structures that can be freely separated from associated seed substrates, allowing for re-use of such substrates and ease of later processing for additional active devices;

Still another aspect concerns methods of making the aforementioned layers, structures, as well as electrically active regions (P-N junctions) and devices incorporating the same;

Another aspect concerns an apparatus that can be used to manufacture the above referenced epitaxial films, structures, etc.

It will be understood from the Detailed Description that the inventions can be implemented in a multitude of different embodiments. Furthermore, it will be readily appreciated by skilled artisans that such different embodiments will likely include only one or more of the aforementioned objects of the present inventions described herein. In particular, the present disclosure forms the basis of several distinct applications covering multiple separate inventions. Thus, the absence of one or more of such characteristics in any particular embodiment should not be construed as limiting the scope of the present inventions.

While described in the context of an epitaxial film for integrated circuit applications, it will be apparent to those skilled in the art that the present teachings could be used in any number of other systems in which it is desirable to improve an epitaxial packaging process.

DETAILED DESCRIPTION

Figure 1:
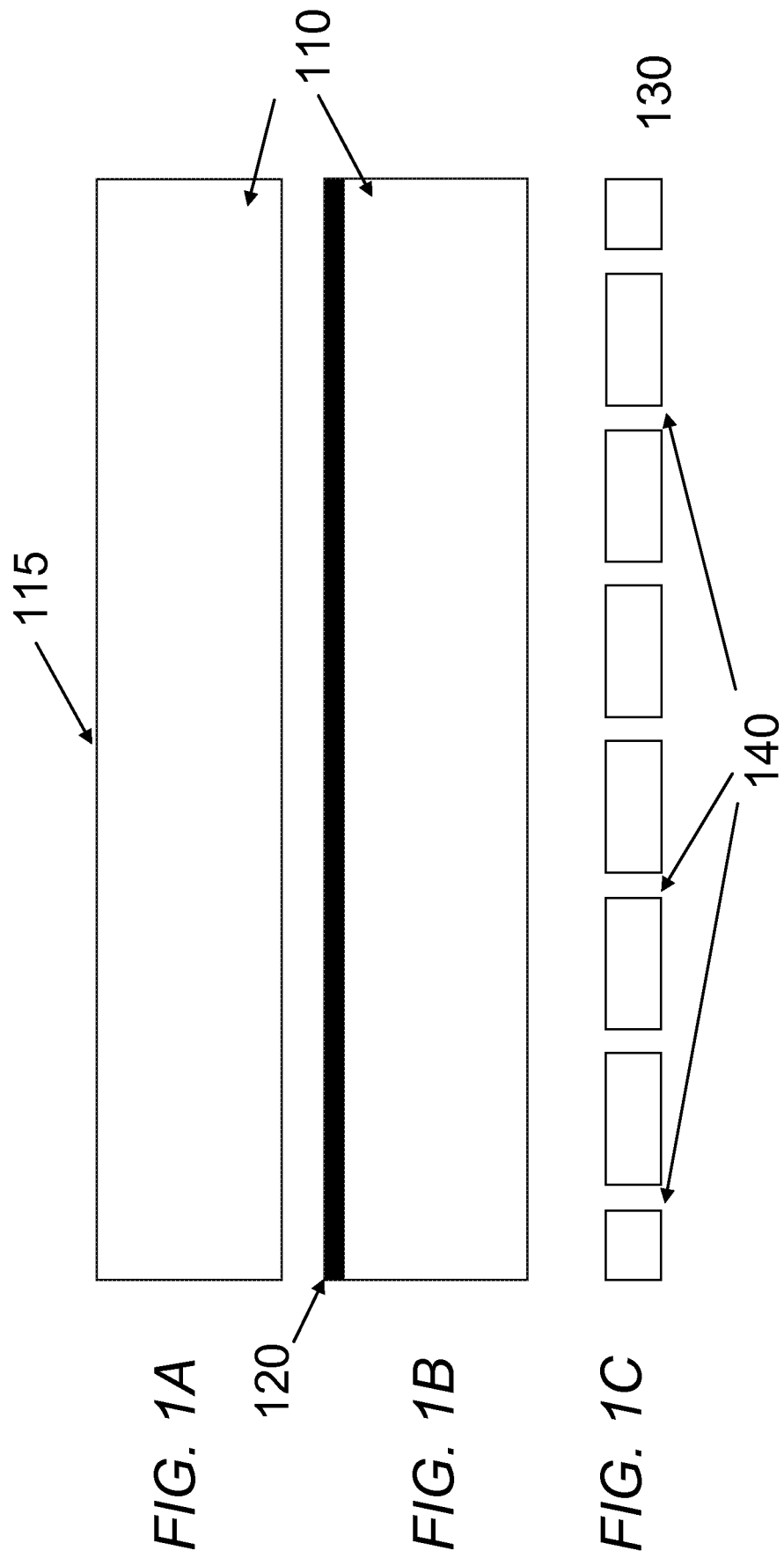
FIG. 1 is a simplified diagram view of a preferred crystalline substrate, an assembly substrate, and a sacrificial layer or metamorphic buffer layer grown on a crystalline substrate as building blocks for layer growth and transfer in accordance with the teachings of the present invention.

The present invention addresses the aforementioned prior art barriers through a preferred simultaneous growth and transfer method of epitaxial structures from a semiconductor substrate to an assembly substrate. The method lowers the material cost by replacing a conventional semiconductor substrate with a lower-cost assembly substrate and further using a low-cost liquid phase epitaxy (LPE) manufacturing process.

Using the preferred method, the assembly substrate standardizes substrate size for further processing regardless of the original material sizes. The epitaxial layer transferred directly unto an assembly substrate provides a unit building block for higher level of device and subsystem integration. Unlike prior art layer transfer techniques, the present invention can preferably transfer an epitaxy layer during layer growth, which provides a number of benefits including low cost, high yield, high material quality, and wide applications.

LPE is a well-known method of growing a material epitaxially on a single-crystalline substrate of a specific crystalline orientation, lattice constant, and defect density. Typically this techniques uses a solution of the material to make contact to and grow a thin layer (10 nm to 100 um) over a substrate surface. The thin layer grows and replicates the crystalline structure of the substrate as in seeded crystal growth. The growth process preferably begins with a melt of the material solution (or growth solution) in an appropriate solvent at supersaturation that is maintained at an elevated temperature and a controlled gas pressure. When the melt is brought into contact with the substrate, materials at the contact interface are in thermodynamic equilibrium at a constant temperature. At a lower but a constant temperature, the material from the melt precipitates and grows epitaxially on the substrate of the same material (homojunction) until a layer of the desired thickness has been grown and the substrate is removed from the melt.

Both growth rate and material composition of the epitaxial layer can be controlled by temperature uniformity, responsive temperature profile, and gas pressure. In many applications, an impurity element (dopant) can be added to a crystal lattice in low concentrations in order to alter the optical/electrical/physical/chemical properties of the crystal material. Therefore, a dopant can be added into the melt and the doped layer can be grown on an undoped substrate. To grow a heterojunction, a multijunction, or a diode structure, it may be necessary to grow a sacrificial layer, a transition layer, or a metamorphic buffer layer of graded compositions and lattice constant on the crystalline substrate. The sacrificial layer or a transition layer may be removed from the crystalline substrate during or after the subsequent growth of epitaxy layer unto an assembly substrate.

An epitaxial lateral overgrowth (ELO) technique uses LPE for preventing defect propagation in forming multiple epitaxial layers (active layers) in microelectronic and optoelectronic devices. ELO is a process for growing an epitaxial layer on partially masked crystalline substrates. Typically, a buffer layer is grown first on the crystalline substrate. Then the crystalline substrate is covered by a thin film patterned with openings or windows by conventional photolithography. Finally, the epitaxial layer is grown inside the openings on the crystalline substrate. The epitaxial layer initially nucleates on the surface of the crystalline substrate and grows vertically from the crystalline substrate inside the masked openings. Once the layer growth reached the top of the mask film, lateral growth begins along the masked film surface.

Depending on the orientation of masked openings relative to the substrate crystal orientation, the ELO technique can provide a faster rate of growth for an epitaxial layer in the lateral direction over narrow openings in a mask layer (such as silicon oxide or metal nitride) deposited atop a substrate than the growth of epitaxial layer in the narrow openings in the vertical direction normal to the substrate surface. The result is typically a single epitaxial layer over the mask layer that is coalesced of lateral grown parts of the layers (wings) from adjacent openings.

Prior studies have shown that these ELO layers exhibit much lower dislocation density than that in standard planar epitaxial layers grown on the crystalline substrate. For example, on (100) GaAs substrates the line seeds aligned at 15°, 30°, 60°, or 75° off from the <011> direction show a large value of lateral to normal growth rate ratio. Other process parameters that may affect lateral growth of different materials include the growth temperature dependence of the normal growth rate and the lateral growth rate in different crystallographic direction, electric field through the growing layer, the amount of dopant introduced to the melt, the solubility of the dopant in the liquid solution, the spacing between windows, and physical properties of the growth solution such as viscosity as a function of temperature, fluid pressure, density, solute diffusion coefficient, etc.

Preferred embodiments of the present invention offer a transformational epitaxy-level packaging (ELP) technique that advances beyond chip-scale packaging (CSP) (where the resulting package is about the same size as the die), wafer-level packaging (WLP) (where the package of integrated circuit is at wafer level), and traditional package and assembly where the package of individual device is after wafer dicing. The preferred ELP of the present invention leverages the ELO process using LPE and provides a streamlined technique that can achieve high yield for epitaxial layer growth and layer transfer from a crystalline parent substrate directly unto an assembly daughter substrate.

The preferred embodiments of the invention can enable transformational material manufacturing and package integration for compound semiconductors with clear advantages in providing low cost, high yield, high quality materials, and wide applications over conventional methods. First, the preferred method can remove the traditional crystalline substrate of compound semiconductors to thus eliminate the cost of crystalline substrate in device. Furthermore, in most applications the crystalline substrate can be re-used.

In addition, preferred embodiments of the invention also save package and assembly costs at least in areas associated with wafer mount, wafer thinning, wafer dicing, and die attach. Second, preferred embodiments of the layer transfer process can be made high yield by liquid-solid phase separation or localized etch in smaller areas that minimizes or eliminates defect-prone separation between two sheets of solids.

Lastly, the ELP growth of the preferred embodiment produces high quality films of near-perfect material quality that is suitable for wide device applications.

Differing from the prior-art layer transfer processes—which generally fabricate the sacrificial or separation layer and an inverted device structure on the first substrate, bond to the second substrate, and remove the sacrificial or separation layer—preferred embodiments of the present invention provide a direct growth and attachment of an epitaxy layer to the second substrate (assembly substrate). Preferred embodiments of the present invention also do not need to resort to fabrication of an inverted device structure in subsequent processing.

The preferred embodiments of the present invention streamline package and assembly steps by eliminating at least wafer mount, wafer thinning, wafer dicing, and die attach. These preferred embodiments provide a wafer level platform where islands of different epitaxy materials can intermix on the same planar substrate. The preferred layer transfer method of the present invention is easily integrable in liquid phase epitaxy equipment for high-throughput and high-yield production.

Three main components are used in preferred embodiments of the present invention. First, a preferred multi-compartment boat apparatus is used for crystalline substrate, assembly substrate, manifold's aperture, and source melt. Second, an assembly board is preferably made of materials that can withstand the thermal requirement of epitaxy growth and is suitable for end applications with patterned openings, slids, or windows and other interconnects or components for epitaxy lateral overgrowth and subsequent layer transfer. Third, a preferred layer transfer mechanism is used to separate a crystalline substrate and the assembly substrate during or after layer growth, and utilizes both multi-zone temperature control from melt to crystalline substrate and mechanical actions.

FIG. 1 shows some of the basic building blocks used in an epitaxy layer growth and transfer process. An upper graph (A) depicts a crystalline substrate 110 of any conventional semiconductor crystalline wafer. A surface 115 of a crystalline substrate provides a two-dimensional nucleation site for an epitaxy layer to replicate the lattice structure of the substrate for homojunction type growth. The crystalline substrate 110 in some cases may not be a whole crystalline substrate but rather multiple and localized nucleation sites on one substrate that match the openings of a patterned assembly substrate.

Middle graph (B) depicts a crystalline substrate with a sacrificial layer or a metamorphic buffer layer 120 grown atop it. The growth method for layer 120 can be of any conventional epitaxial growth method, such as MOCVD, LPE, VPE, MBE, MOVPE, etc.

A sacrificial layer 120 is preferably of different material composition from but lattice-matched to crystalline substrate 110. A metamorphic buffer layer 120 includes graded compositions and a lattice constant to the crystalline substrate. A sacrificial or a buffer layer 120 is preferably used for growing heterojunction, multijunction, or diode structures.

Sacrificial layer 120 may be removed in post-epitaxy growth to separate an assembly substrate from the crystalline substrate in case of transfer of an epitaxy layer having a large surface to volume ratio. Bottom graph (C) shows an assembly substrate 130 with patterned holes, slits, or windows 140 that are open through the thickness of the assembly substrate 130. A side profile of the holes, slits, or windows can be vertical or step recessed or sloped to any desired angle.

Figure 2:
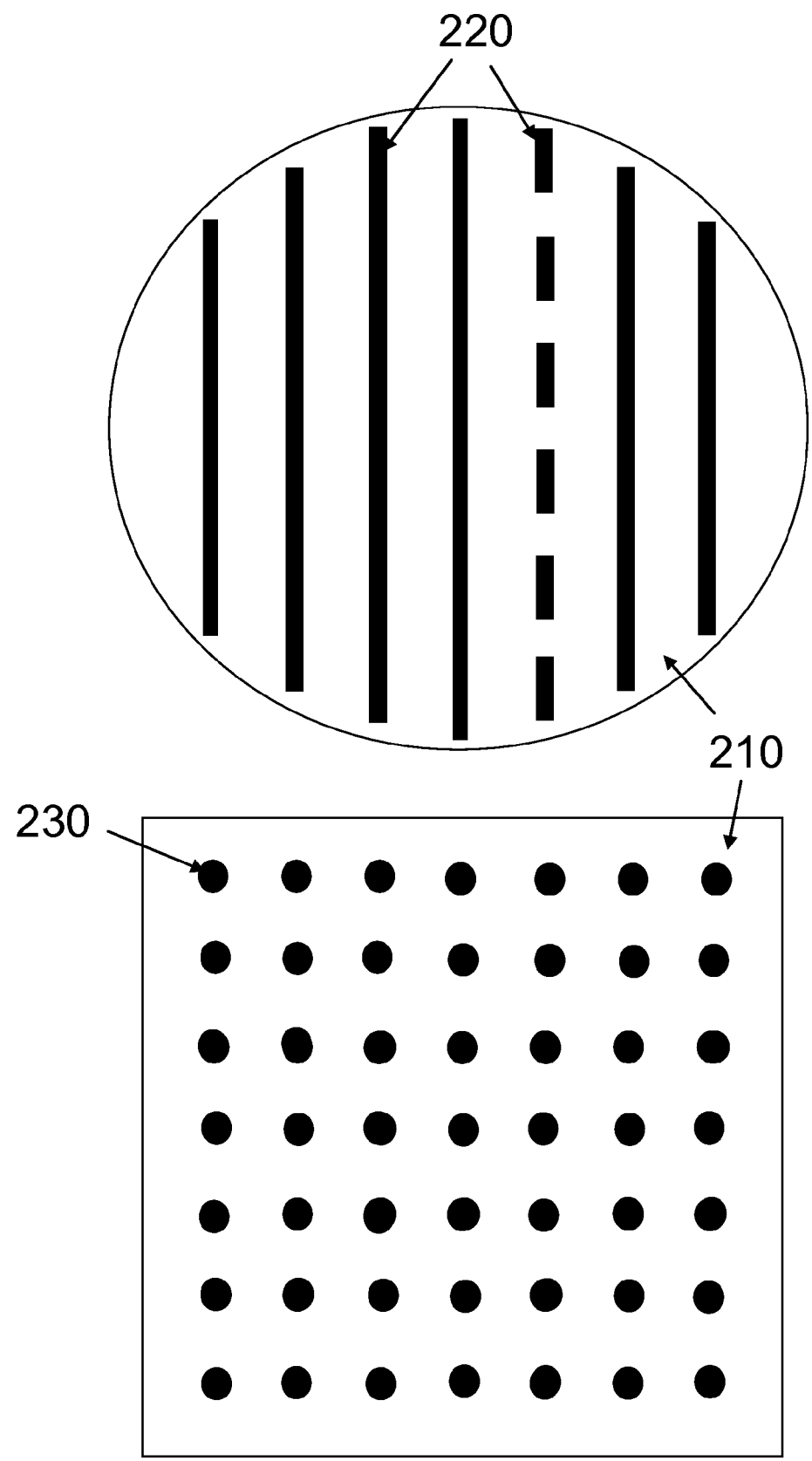
FIG. 2 is a top view diagram of a preferred assembly substrate made in accordance with the teachings of the present invention.

FIG. 2 is a top view diagrammatic of the assembly substrate 210 illustrating different patterns, shapes, spacings, and sizes for openings such as slits or windows 220 and holes or wells 230 for the initial epitaxial growth in direction vertical to the crystalline substrate surface and later epitaxial lateral overgrowth. The assembly substrate 210 is preferably made of a solid, rigid material and can be thought of as a template or stencil for a desired epitaxial layer geometry, structure and arrangement for an integrated circuit. The openings in the assembly substrate define a multidimensional pattern to be imparted to a thin film epitaxial layer. Accordingly the substrate is adapted to receive a liquid phase epitaxial material and has thermal characteristics sufficient to support growth of epitaxial material within the openings without causing damage to the substrate that would prevent it from being used in subsequent conventional semiconductor processing steps for making active devices.

This substrate 210 is thus preferably a single or multi-layered ceramic substrate that is thermally matched to the thin single-crystal epitaxial layer to be transferred onto or any substrate materials that has lower cost than the crystalline substrate and properties that fits specific product and application requirements. Accordingly other choices for materials for substrate 210 will be apparent to those skilled in the art from the present teachings. A significant advantage of growing epitaxy layers on assembly boards of the present invention is that the latter then can serve just like a conventional wafer for later processing steps. It can be subjected to wafer processing for device/IC formation. It can save significant operational steps and costs in wafer mount, wafer thinning, wafer dicing, and die attach.

Figure 3:
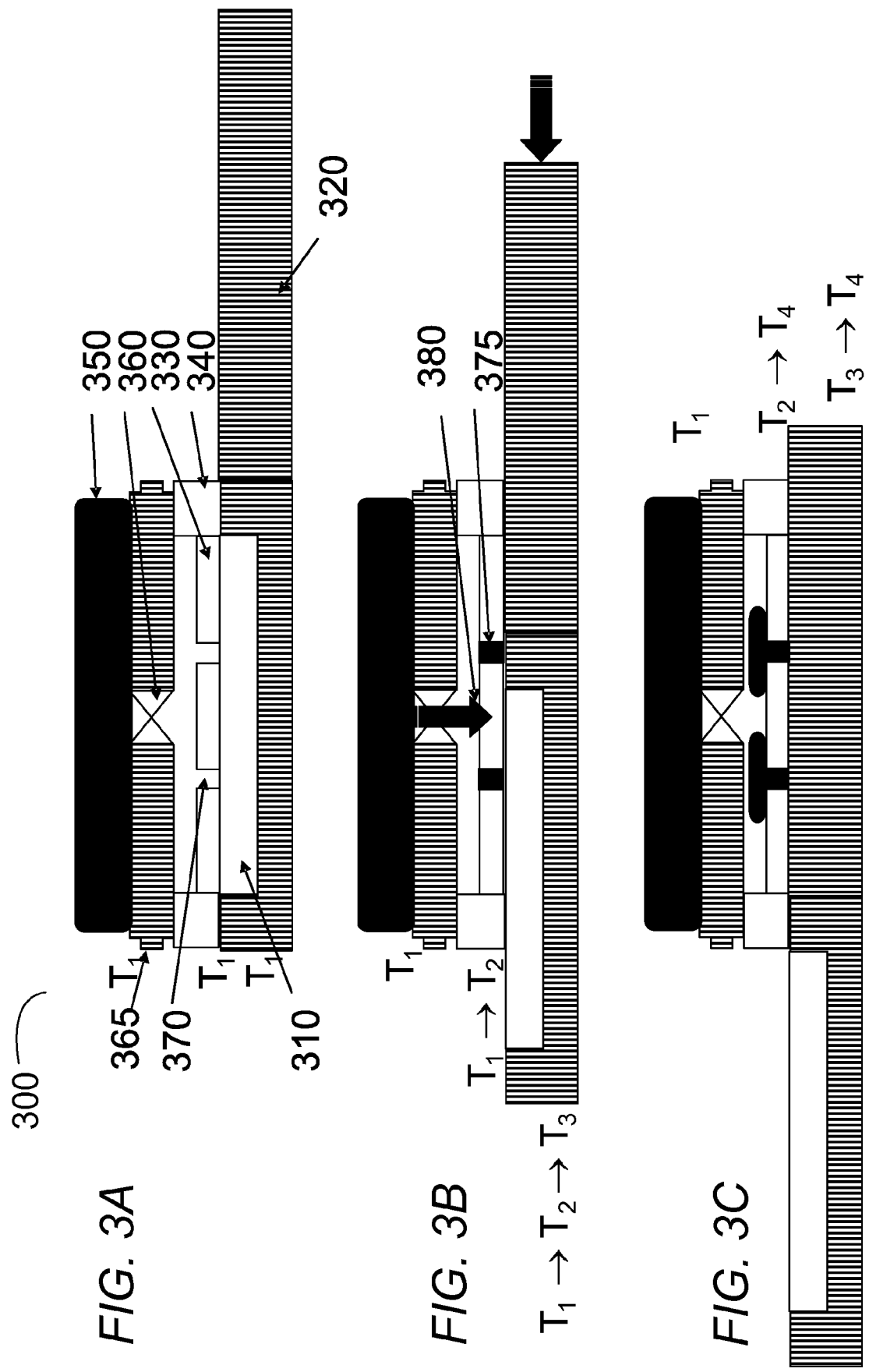
FIG. 3 is an illustration of a preferred method of growing and transferring an epitaxy layer from a crystalline substrate to an assembly substrate by liquid phase epitaxy.

FIGS. 3A-3B illustrate a novel method of growing and transferring an epitaxial layer from a crystalline substrate with or without a sacrificial layer or a buffer layer to an assembly substrate by liquid phase epitaxy (LPE). This mechanism generally employs a procedure by which an epitaxial apparatus 300 forms an epitaxial layer within an assembly substrate on top of a crystalline substrate, which is then heated sufficiently so that it can be "swiped" or mechanically sheared off the surface of the substrate.

In FIG. 3A a crystalline substrate 310 is preferably placed in a holder of apparatus 300, which preferably includes a platform (not shown) and a recessed base of a boat 320, which is preferably made of graphite or similar material. Graphite is a preferred material for material availability in high purity form, being easily machined, and being not wet by metals. An assembly substrate 330 is preferably enclosed by a barrel or frames 370 preferably comprised of graphite or similar material and placed atop crystalline substrate 310. It will be understood that other well-known mechanisms can be employed by apparatus 300 to secure the assembly substrate/template and effectuate the goals of the invention.

The LPE melt in a single or multiple melt pockets 350 preferably sits stationary and the resulting melt is directed unto the assembly substrate 330 preferably through aperture's 360 in a manifold 365 (preferably comprised of graphite or similar material) and then ultimately unto the surface of the crystalline substrate 310 through openings 340 in the assembly substrate. The form of LPE melt 350 can take any number of forms commonly known in the art.

The manifold 365 may have one or more additional apertures 360 (not shown) and other conventional control mechanisms for controlling the overall rate and amount of melt dispensed. For example the manifold may be movable within apparatus 300 to dispense the melt across the surface of the assembly substrate. The melt dispensation is selective of melt pockets, time controlled, volume controlled, temperature controlled, location specific through the arrangement of manifold, and either stationary or motion controlled, for example, sliding, rotational, in a scanning motion, or any other moving mechanisms. The manifold apertures thus define an aperture plate used by apparatus 300 to selectively control an area used for localizing the dispensing of the melt as well.

Other approaches are possible as well. For example the topology of the mechanism could be inverted so that the assembly substrate is flipped with the melt bath introduced into the bottom of the on the bottom of the boat 320. In some applications it may be possible to introduce the melt directly onto the crystalline substrate first, with the assembly substrate then physically pressed/superimposed on top of such melt so as to displace and force the bulk of the melt into openings 340 where it can begin to crystallize. Residual material on the bottom of the substrate could be removed by any number of conventional mechanisms without disturbing the resulting template in assembly substrate 330. The geometry/spatial relationship between the manifold 365 and assembly substrate 330 can be configured as well to optimize the distribution of the melt from chamber 350 to the desired openings 340. Accordingly other orientations are possible, and all that is required is that there be some reliable mechanism for introducing the melt in a manner that allows controlled growth at a substrate interface at the bottom of openings 340.

The zones where the crystalline substrate, the assembly substrate, and the melt situate are situated are each preferably temperature controlled. Initially, as seen FIG. 3A all three zones are preferably of the same temperature $T_1$ at or slightly above the bulk melting temperature of the melt. Control of the temperatures in these areas to control the melt properties within apparatus 300 can be achieved by any number of well-known techniques. For example the entire assembly 300 may be maintained in a temperature controlled chamber of a furnace, a reactor, and/or conventional heat conduction and/or convection mechanisms may be employed to provide localized heat energy to these zones.

In FIG. 3B, an epitaxial layer 375 is formed when substrates 310 and 330 and the localized melt 380 are slowly cooled to an end temperature $T_2$ corresponding to a supercooling point for the particular melt. At this temperature segregation of solute from the melt results on the substrate, that is, the epitaxy layer 375 begins to grow. The entire layer is then solidified over some predetermined time in a direction extending from the bottom of openings 340 to a surface of the assembly substrate 330. The time and temperatures required will be a function of the thickness of the epitaxial layer, the compositions of the substrates, etc., and can be determined experimentally using routine skill. In any event, the end result of this process is a completed epitaxial layer formed within the substrate/template 330 having a desired geometry, structure, material and doping composition suitable for use in any conventional integrated circuit requiring such layers.

Apparatus 300 is further adapted so that preferably either or both the barrel or frame 365 or the crystalline substrate holder 320 or both can be physically moved with respect with one another. This allows for a swiping or shearing action that can be used to detach the completed epitaxial layer 375 from the underlying substrate 310 and allow it be integrated as part of an additional semiconductor circuit.

Thus, as seen in FIG. 3C, during or after the epitaxial layer growth, the crystalline substrate holder 320 temperature is preferably raised to a surface pre-melting temperature $T_3$ just below a re-melting temperature of the bulk of epitaxial layer, which event causes epitaxial layer 375 to begin to pre-melt by lattice heating at the epitaxial layer-to-crystalline substrate interface, and in particular in the bottom of openings 340. It will be understood of course that other mechanisms for bringing about this pre-melt temperature can be employed, including by adding one or more heating elements embedded inside or as part of the crystalline substrate holder and even the assembly substrate barrel or frames, a heat lamp inside or under the crystalline substrate holder, or a RF induction heated system applied to the crystalline substrate holder. Alternatively, a meshed heating element made of resistance wires, a thin heating plate, a sheet of carbon nanotube, or a thin film of positive thermal coefficient ceramic placed on top of the crystalline substrate with openings for epitaxial growth unto the assembly substrate. Other examples will be apparent to those skilled in the art.

At the same time (or after some predetermined time based on measuring the pre-melt temperature, or some other time factor) apparatus 300 employs a mechanical action to move barrel 370 and crystalline substrate holder 320 from each other to separate the epitaxial layer from the surface of crystalline substrate. Mechanical actions may be swiping, sliding, rotation, spinning, pulling, tearing, vibration, stepping, breaking, cutting, or any combination (simultaneous or sequential) thereof. While a mechanical action serves to slide or shear the epitaxial layer 375 from the crystalline substrate 310, it will be apparent to those skilled in the art that other mechanisms may be used to separate the two materials. For example in many instances the surface area of the epitaxial layer is relatively small compared to the overall surface area so the amount of physical adhesion is relatively small. In such event it may not be necessary to employ any physical force to shear the interface, and, instead, it may be possible simply to gradually lift the assembly substrate 330 in a timed/controlled fashion (again using a mechanical arm/fingers not shown) to achieve the same result in a lift-off fashion.

At the completion of layer separation and transfer as illustrated in FIG. 3C, the temperatures of both the barrel and crystalline substrate holder are preferably lowered in apparatus 300 eventually to approximately an ambient or room temperature $T_4$. More precise growth control may be accomplished in some instances within apparatus 300 by microheating and cooling elements in combination with or without a conventional Peltier-induced LPE in which an electric current (generated by electric field or induced by magnetic filed) is passed through the substrate-melt interface and heats and cools it by a well-known Peltier effect. The growth takes place at a constant temperature and growth rate is proportional to an applied current and/or applied field. Again other techniques can be employed with the present invention.

Figure 4:
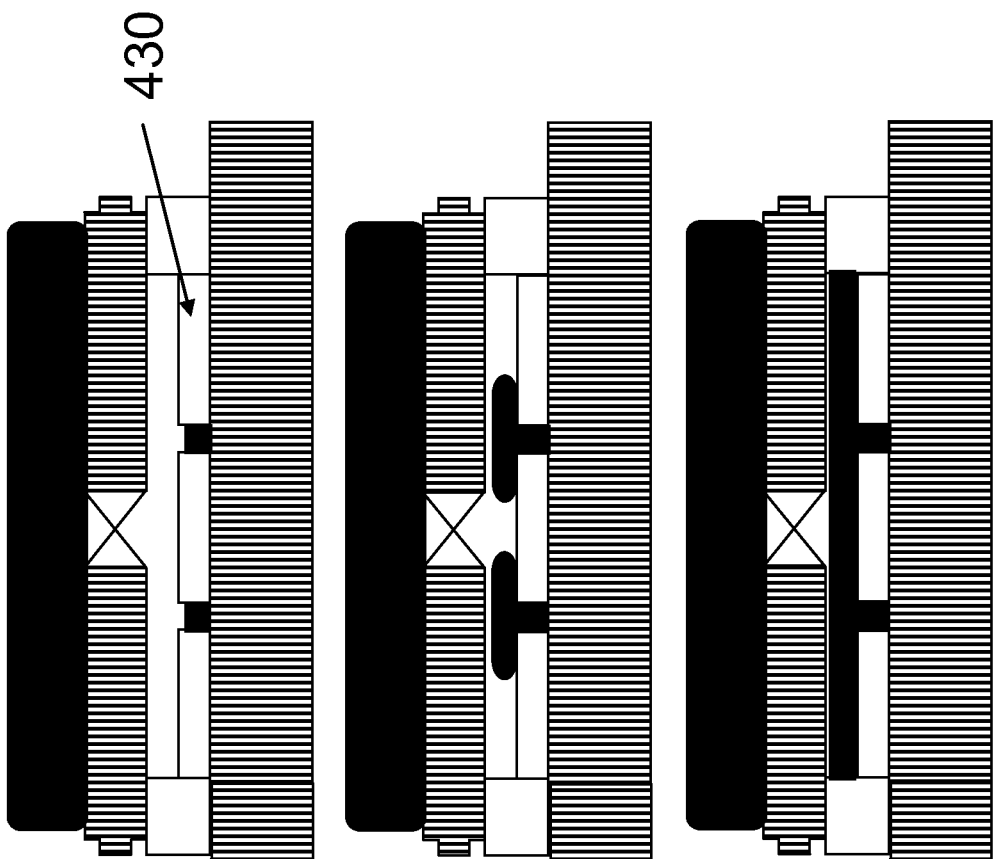
FIG. 4 is an illustrative diagram of various preferred forms of epitaxy layer at the completion of layer transfer.

FIG. 4 shows various forms of epitaxial layers after completion of epitaxial layer growth and subsequent layer transfer from crystalline substrate 410 to an assembly substrate 430. FIG. 4A describes a discrete epitaxial layer in the openings of the assembly substrate, corresponding epitaxial lines of a desired width and configuration. FIG. 4B describes islands of a desired width and length forming an epitaxial layer on the assembly substrate. FIG. 4C describes a continuous epitaxial layer or film on the assembly substrate, again having a desired thickness.

Figure 5:
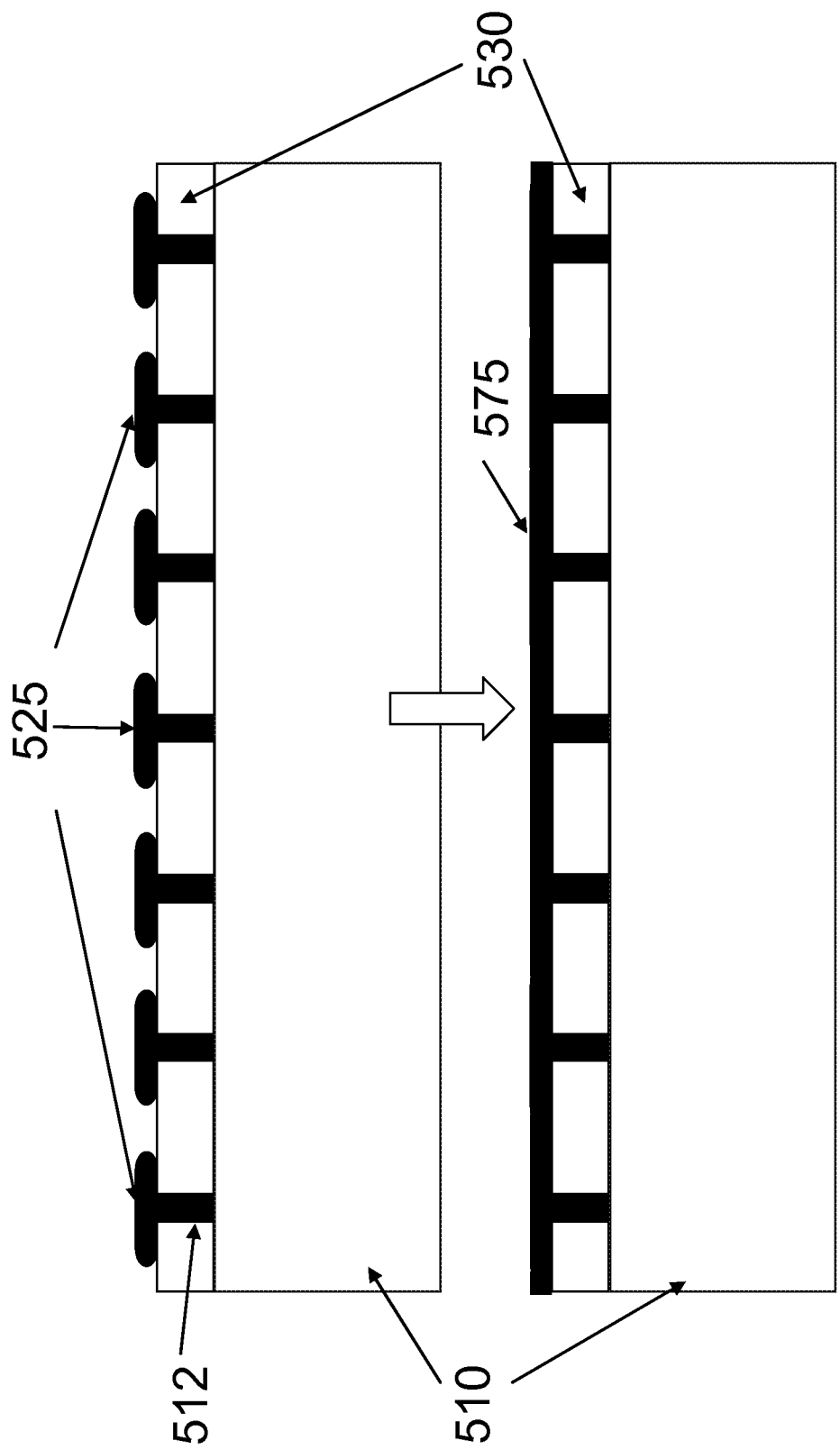
FIG. 5 is a simplified diagram of the preferred growth of epitaxy layer by LPE.

FIG. 5 illustrates a growth of an epitaxial layer 575 by LPE in circumstances where there is an initial vertical growth 512 from a crystalline substrate 510 through the openings of an assembly substrate 530 and subsequent lateral overgrowth of islands 525 on the surface of the assembly substrate. These islands may continue to grow laterally and coalesce to form a single film 575, which may serve as the base for additional epitaxial layers to grow on top thereof in subsequent processing operations. It will be apparent from these illustrations that the thickness, size, geometry and orientation of the epitaxial structures (including islands, through-holes and lines) can be controlled and configured in any manner of desired topology based on the characteristics of the assembly substrate.

In other embodiments it may be desirable and/or feasible to control compositional variations within the epitaxial layer, such as by adding doping and/or structural gradients. To do this the melt composition could be varied by time so that at a first time a particular melt composition/doping is added, while at a subsequent time a different melt mix (with different composition/doping) is added. Again the process can be automated to create graded epitaxial layers of any desired chemical, physical and electrical properties as needed for any particular application. In other instances the assembly substrate could be used to assist in tailoring the epitaxial film characteristics, including by physical configurations and other variations for altering the film growth and/or composition.

Figure 6:
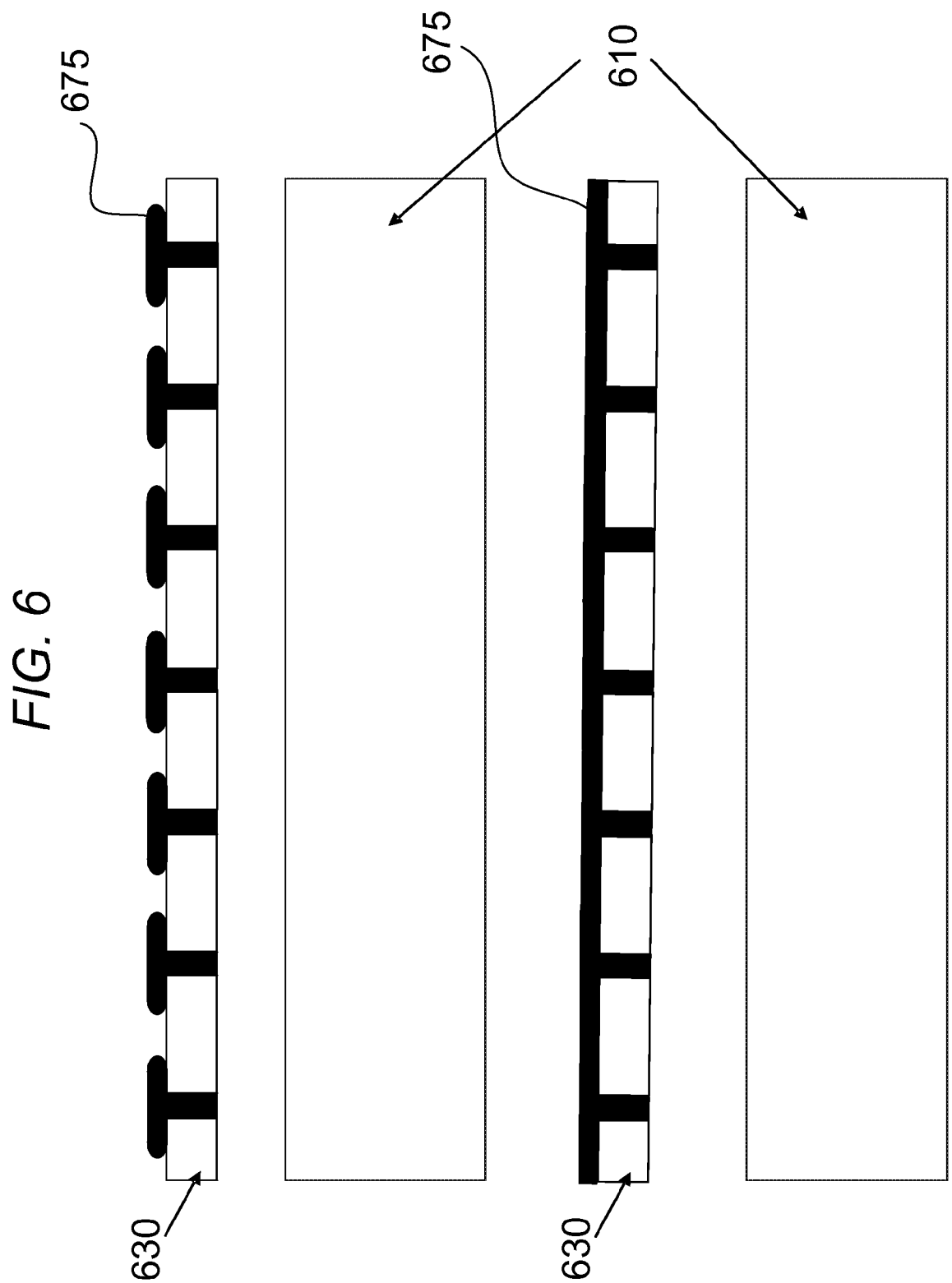
FIG. 6 is an illustrative diagram of the preferred separation of the grown epitaxy layer on an assembly substrate from the crystalline substrate.
Figure 7:
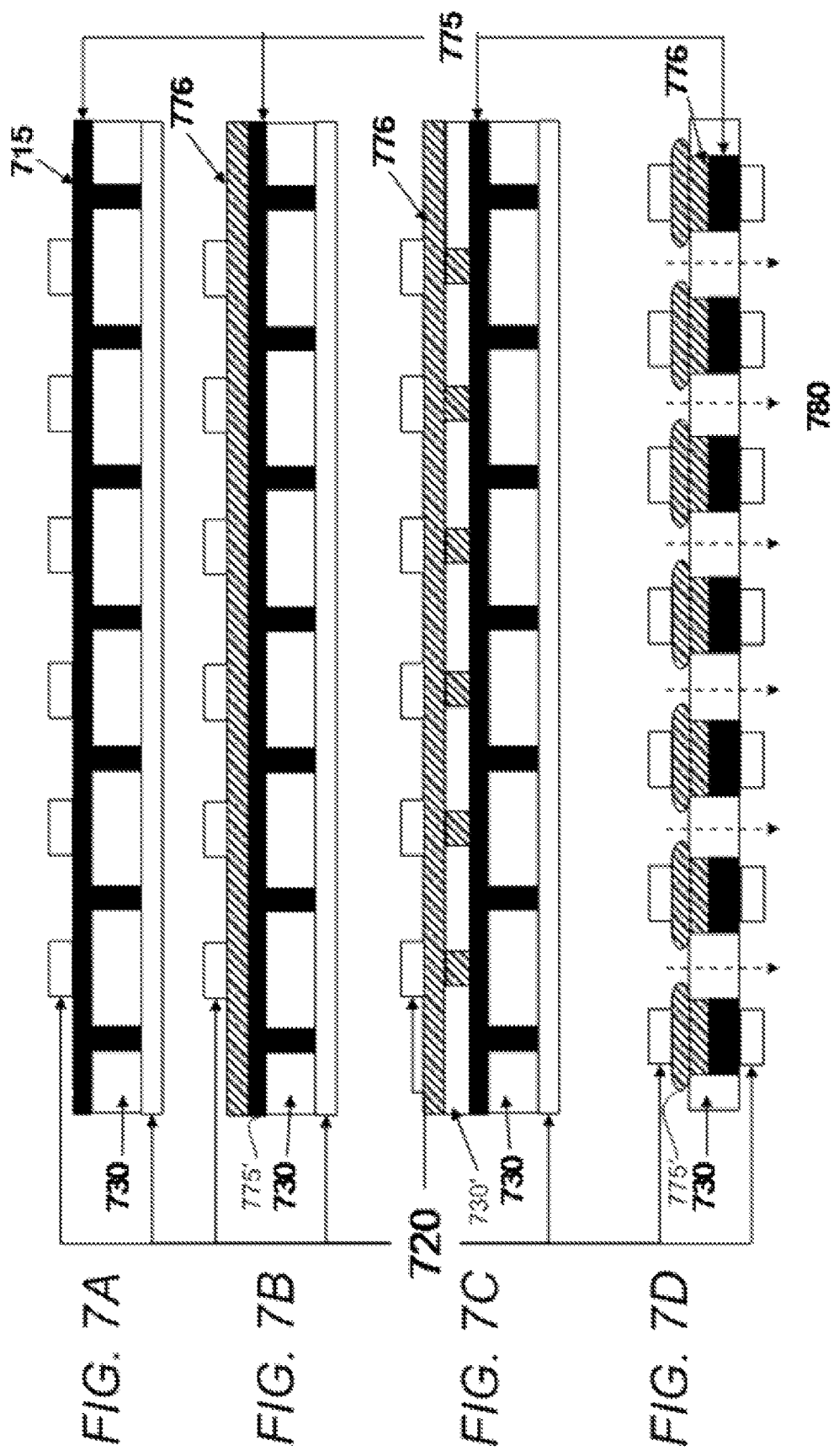
FIG. 7 is an illustrative diagram of various preferred device structures resulting from layer transfer and subsequent processing.

FIG. 6 illustrates generally the separation of a grown epitaxial layer 675 on an assembly substrate 630 from a crystalline substrate 610. As noted earlier the separation may take place during epitaxial layer growth or after epitaxial layer growth by a combination of temperature and mechanical means as described in FIGS. 3A-3C.

FIGS. 7A-7D illustrate how the invention's techniques can be used to manufacture more complex epitaxial structures. These device structures include epitaxial layers 775 with additional processing steps and patterned layers 720. As is apparent from FIG. 7, the number of additional epitaxy layers, epitaxy islands or continuous epitaxy layers, post-epitaxy processing steps, device structures, device layout, dimensions, and patterns can be varied as desired for different products and applications. In particular the invention can be used for making devices which include:

(A) single junction
(B) double junction or multi-junction (monolithic)
(C) double junction or multi-junction (hybrid)
(D) single junction, double junction or multi-junction within openings In FIG. 7A a single junction or homojunction device can be formed with one continuous layer on the assembly substrate 730. An active region (e.g. p-n junction) 715 may be formed after the epitaxial layer completes an initial lateral overgrowth forming a continuous layer. Thereafter a p-n junction 715 may be grown using conventional processing techniques. In general the completed epitaxy-on-assembly substrate is advantageous because it can be used for post-epitaxy processing like any wafer fabrication for device and/or integrated circuit formation. The size and thickness of the assembly substrate can also be made to match that of any semiconductor wafer that fit into the wafer fabrication and handling.

In FIG. 7B a second continuous epitaxy layer 776 is manufactured on the surface of an underlying first epitaxial layer 775. Thus an epitaxial layer can be grown on an assembly substrate (instead of the crystalline substrate). In this manner the assembly substrate 730 can now serve as the base for double or multi-junction active layer formation monolithically through another LPE or even by any conventional epitaxy growth means.

FIG. 7C provides an alternate method to form double junction or multi-junction layers that is not purely monolithic but instead part of a hybrid package or a modular integration that may consist of stacking of multiple device assembly layers intermixed with multiple epitaxy layers and/or different localized pockets of epitaxy materials and devices of different functionalities. As seen therein, a first assembly substrate 730 containing a first epitaxial layer 775 is formed, followed by a second assembly substrate 730' containing a second epitaxial layer 776'. Again the composition and properties of the layers can be tailored as needed for any function.

FIG. 7D describes yet another scheme of forming single junction, double junction or multi-junction within the openings of an assembly substrate 730 such that discrete devices (shown as stacked layers of active devices and epitaxial layers 775, 776) can be formed, assembled, and separated by cutting directly the assembly substrate in the area noted with a hash marks 780.

Figure 8:
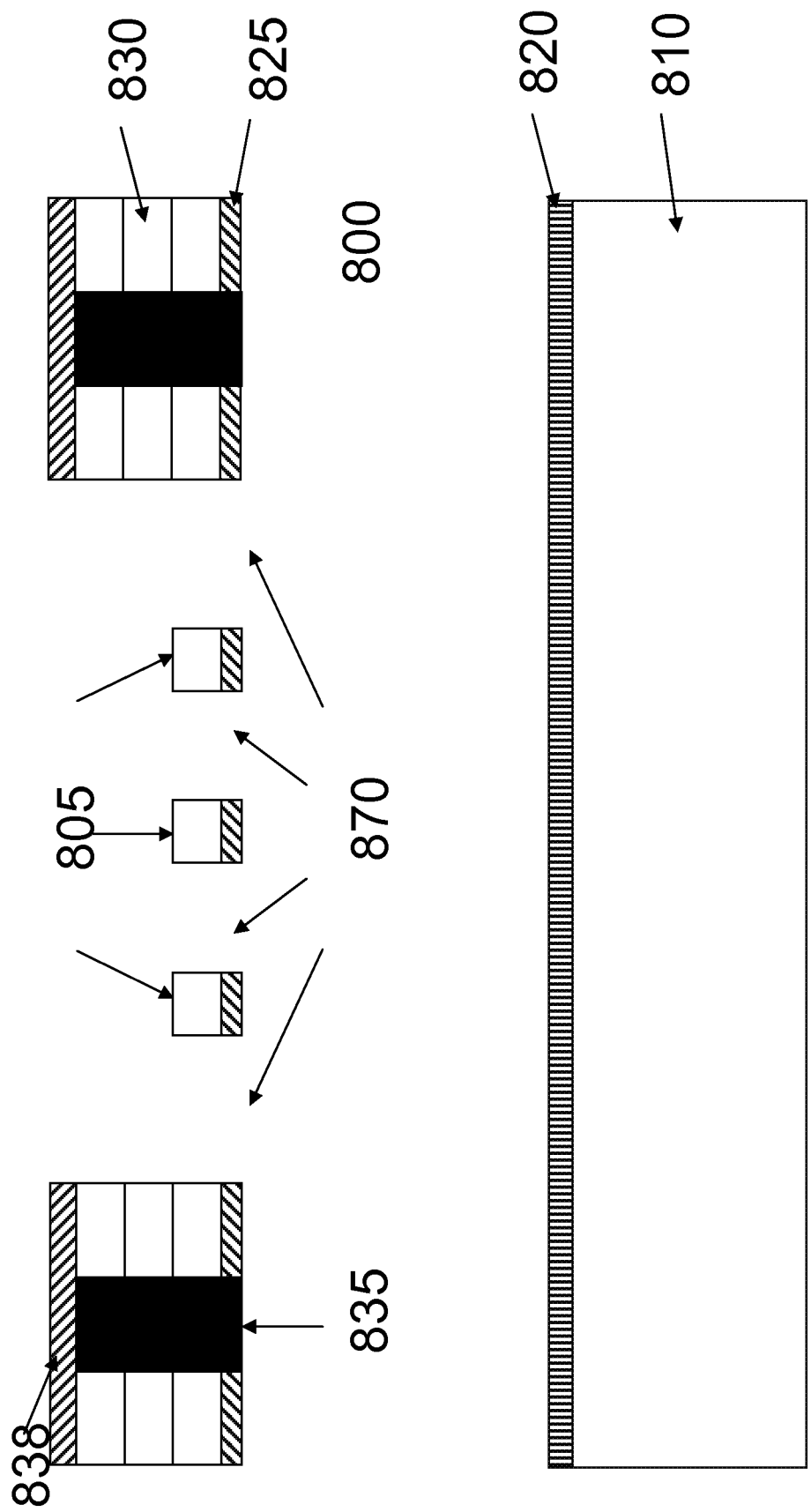
FIG. 8 is a simplified diagram of a preferred assembly substrate for layer growth and transfer of heterojunction, multijunction, or diode structure.

FIG. 8 is a simplified diagram of another embodiment of an assembly substrate 830, including other preferred novel features such as a mesh (and/or a patterned plate as shown in FIG. 2) 805, a patterned adhesion layer 825, cavities 835, and a plate 838 to cover cavities, prior to making contact to a crystalline substrate 810 with a sacrificial layer 820. Except where noted like reference numerals are intended to correspond with similarly referenced components identified above in prior figures. Thus the assembly substrate 830 can be of a one or multi-layered ceramic substrate that is thermally matched to the thin single-crystal epitaxial layer to be transferred onto or any substrate materials that has lower cost than the crystalline substrate and properties that fits specific product and application requirements.

The adhesion layer 825 can be of a metallic film, an organic film, or an adhesive tape. The adhesion layer may be necessary for cases when the epitaxy layer surface-to-volume ratio is large, the thickness of assembly substrate is much thicker that the epitaxy layer, or the epitaxy layer is grown and attached directly to the backside, the surface that contacts the epitaxy layer first during growth, of the assembly substrate.

The assembly substrate 830 can have patterned openings 870 and other devices or components previously formed. Epitaxial layer transfer may be accomplished through thermal and/or mechanical means as described in FIG. 3. The embodiment of FIGS. 8-13 uses an etchant to help detach the epitaxial layer, rather than primarily heat/mechanical means. In this instance of using an etch to accomplish layer transfer, cavities 835 are used for guiding etchant to remove sacrificial layer after epitaxial growth and the plate 838 is used to cover cavities 835 during epitaxial growth. Therefore the purpose of plate 838 is to prevent the introduction of material in these cavities during this deposition operation. Instead, as seen in FIG. 8, openings 870 are areas where epitaxial growth takes place. The patterned plate 805 may have special optical, electrical, mechanical and/or other properties that suit the device applications. For example, the plate may be of glass, acrylic, other transparent, beam collection, or beam steering media for the solar cell application.

Figure 9:
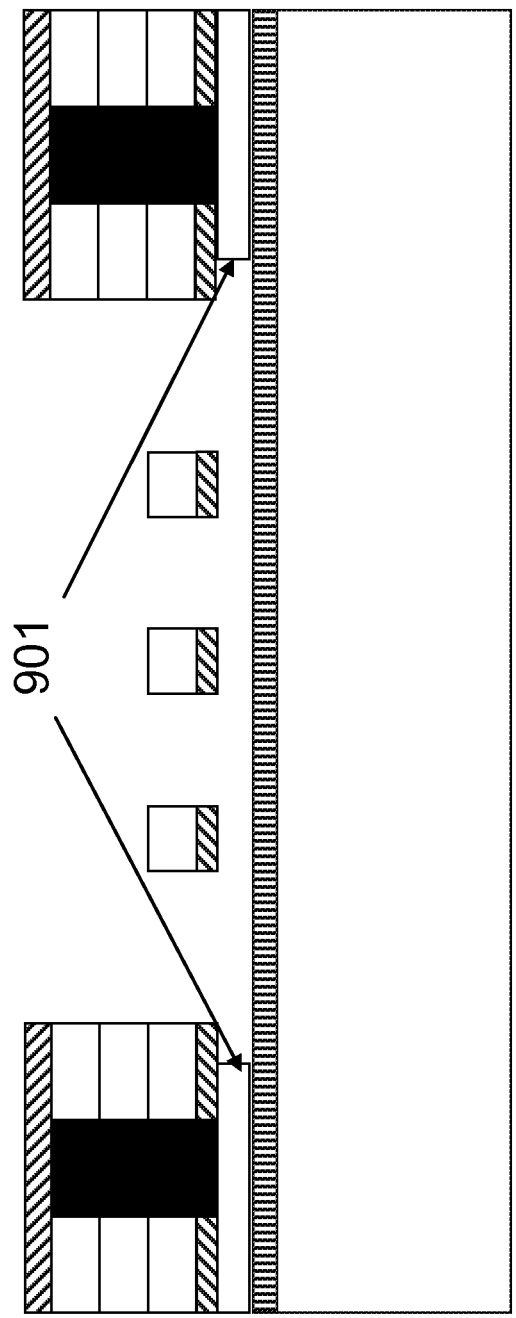
FIG. 9 is an illustrative diagram of two structures described in FIG. 1 and FIG. 8 that are brought into physical contact.

FIG. 9 shows additional novel feature of a preferred spacer 901 when the epitaxy layer is to be grown and attached directly to the backside of a device, the surface that contacts the epitaxy layer first during growth, The contact on either side can be patterned, interlocked, or formed with a spacer 901 to open up the space for subsequent epitaxial film growth and required thickness. The spacer 901 may be deposited directly on the sacrificial layer or the crystalline substrate such as a patterned silicon nitride thin film or other materials of thin layer. The spacer may also be a patterned sheet or plate that makes physical contact to the surface of sacrificial layer or the crystalline substrate. The use of different types of spacers therefore can be used to configure/alter an epitaxial layer geometry and arrangement on an underlying substrate.

Figure 10:
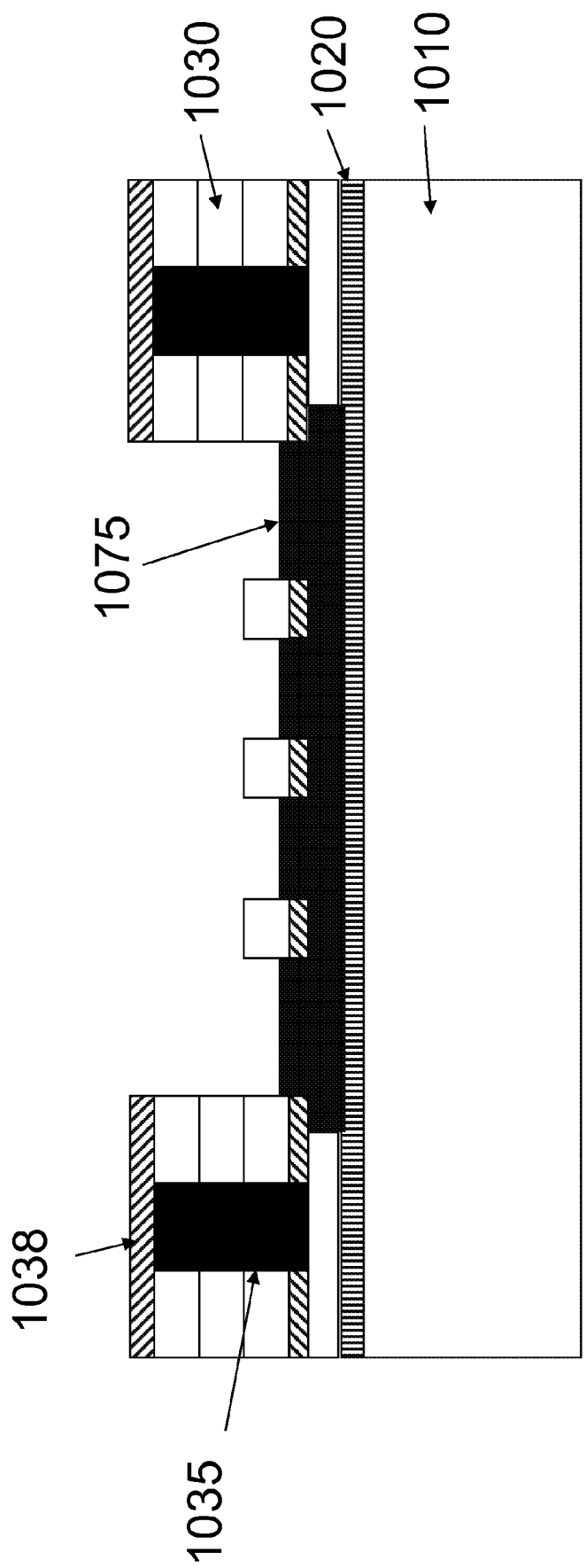
FIG. 10 is an illustrative diagram of the preferred growth of epitaxy layer on the combined structure in FIG. 9.

FIG. 10 is an illustrative diagram showing the preferred growth of epitaxial film 1075 on the crystalline substrate 1010 or on a sacrificial layer or buffer layer 1020 through the patterned openings of the assembly substrate. The crystalline substrate 1010 and the assembly substrate 1030 can be positioned in particular orientations to best fit the epitaxial growth apparatus and growth conditions. As with FIG. 8 a plate 1038 covers cavities 1035. Epitaxial lateral overgrowth (ELO) can be implemented by applying a heating element or mask placed on top of crystalline substrate 1010. Otherwise, ELO usually does not apply to growth directly on the crystalline substrate because the growth occurs in the vertical direction perpendicular to the surface of the crystalline substrate.

Figure 11:
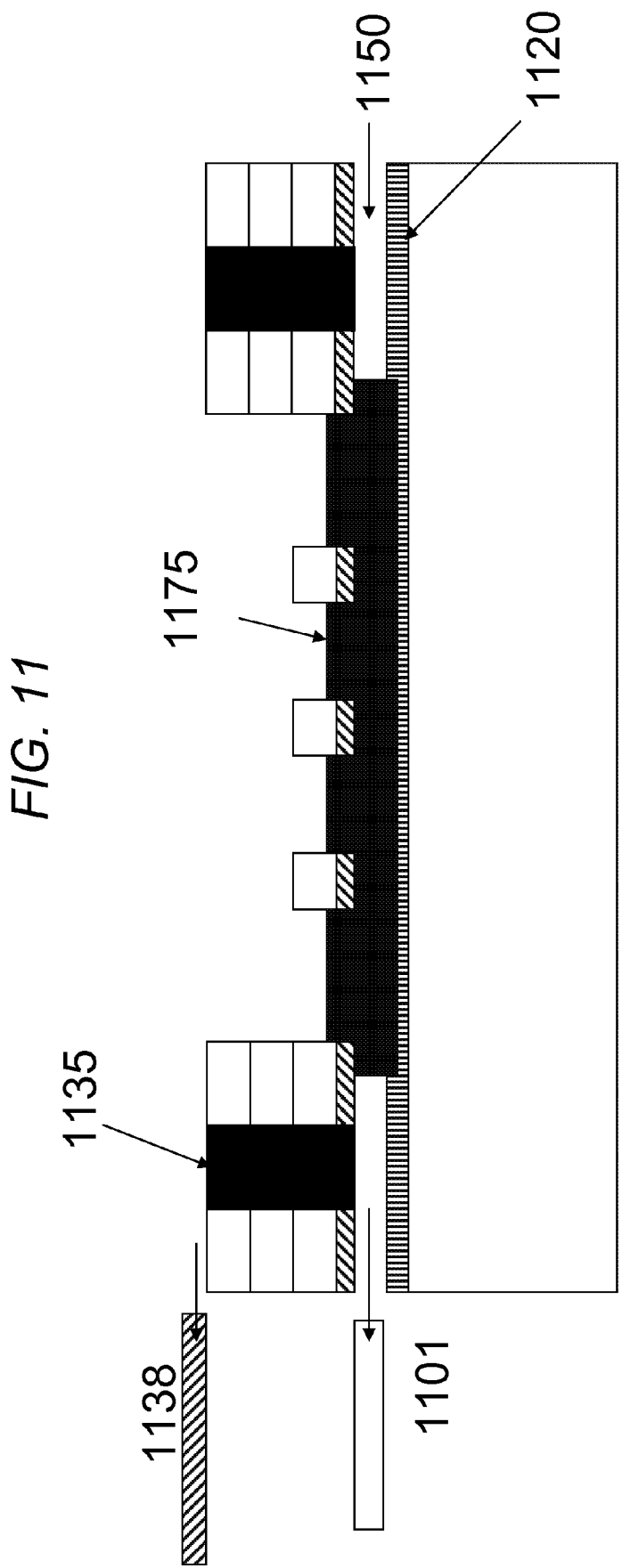
FIG. 11 is an illustrative diagram of the preferred preparatory steps before the separation of the sacrificial layer or buffer layer from the crystalline substrate or removal of the sacrificial layer.

FIG. 11 is an illustrative diagram showing the later removal of plate 1138 covering cavities 1135 and spacer 1101. Sacrificial layer or buffer layer 1120 can be removed by a combined thermal and mechanical means as described previously in FIG. 3 or by other physical, chemical, ionic bombardment, thermal, mechanical, electromechanical, optical means, or a combination thereof. In a preferred approach using a chemical process, a selective etchant can be applied onto the sacrificial layer 1120 through the cavities 1135 and/or an edge portion 1150. The details of the etch chemistry recipe can be determined using routine skill based on the composition of an underlying substrate, sacrificial layer 1120, epitaxial film 1175, etc.

Figure 12:
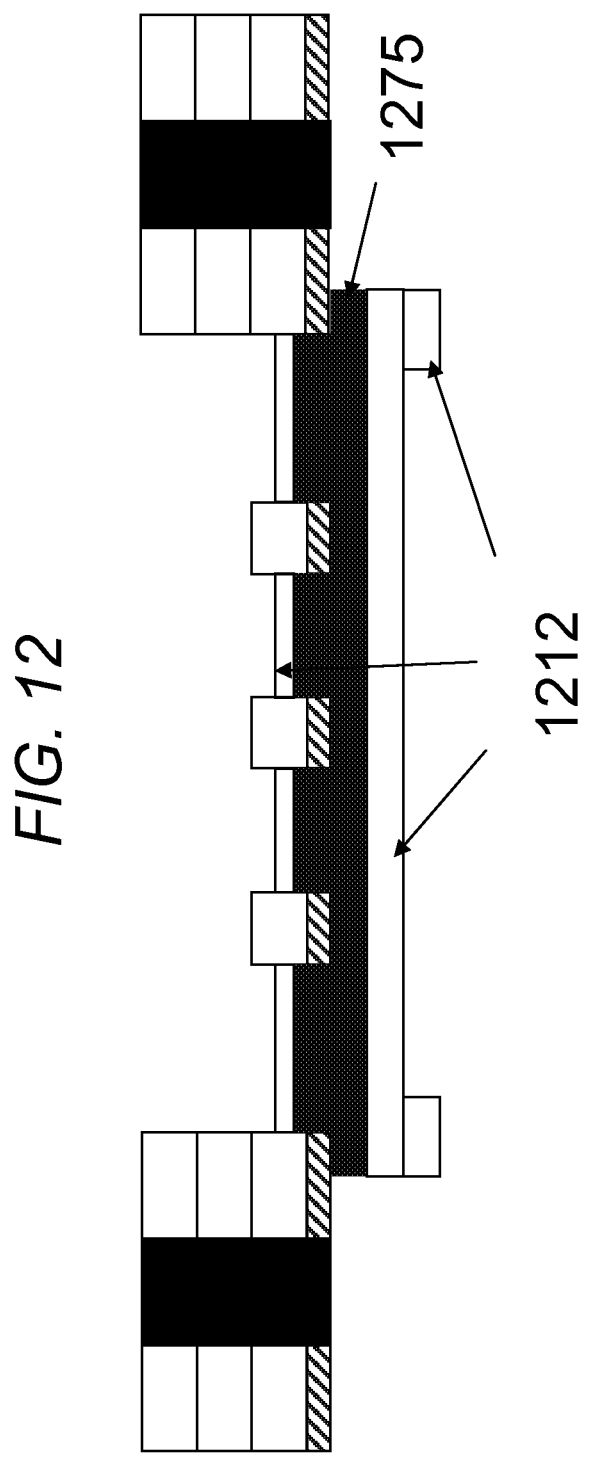
FIG. 12 is a simplified diagram of the preferred epitaxy layer on the assembly substrate after the separation from the crystalline substrate.

FIG. 12 is a simplified diagram of the completed epitaxial film 1275 as it may be employed on the backside of an assembly substrate as part of an electrically active region to be used with integrated circuits. The assembly can be further processed with additional epitaxy layers, processing steps, and patterned layers 1212 that may include metallization, thin film etching. film deposition, and/or encapsulation to form desired devices such as solar cell, light emitting diode, and other integrated circuits for a desired applications.

Figure 13:
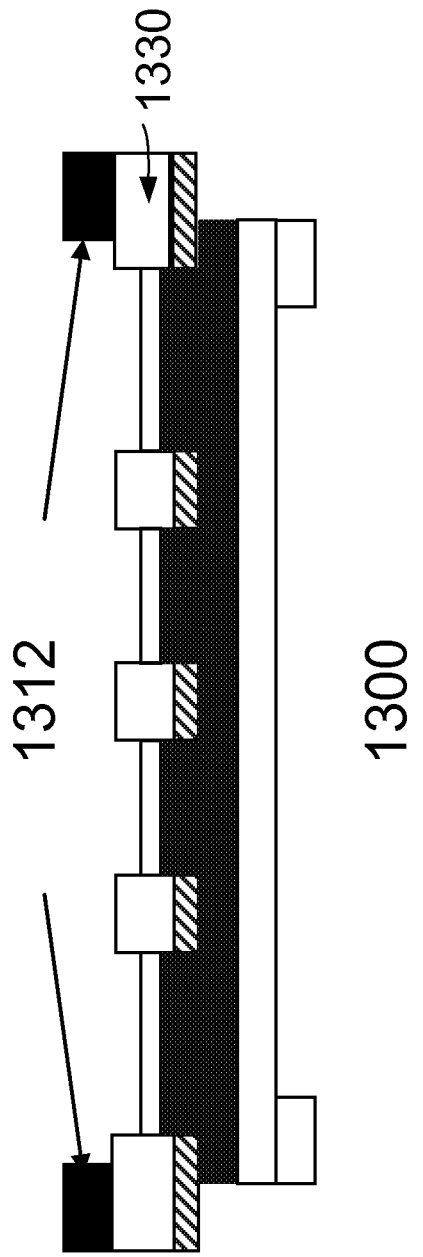
FIG. 13 is a simplified diagram of the preferred formed device.

FIG. 13 is a simplified diagram of a completed device 1300 that is separated by means of saw, scribe and break, or chemical etch. The separated discrete device 1300 on assembly substrate 1330 can be further processed and/or assembled with final dimensions with additional components 1312. The assembled package can be further incorporated into a module or higher integration as desired.

Figure 14:
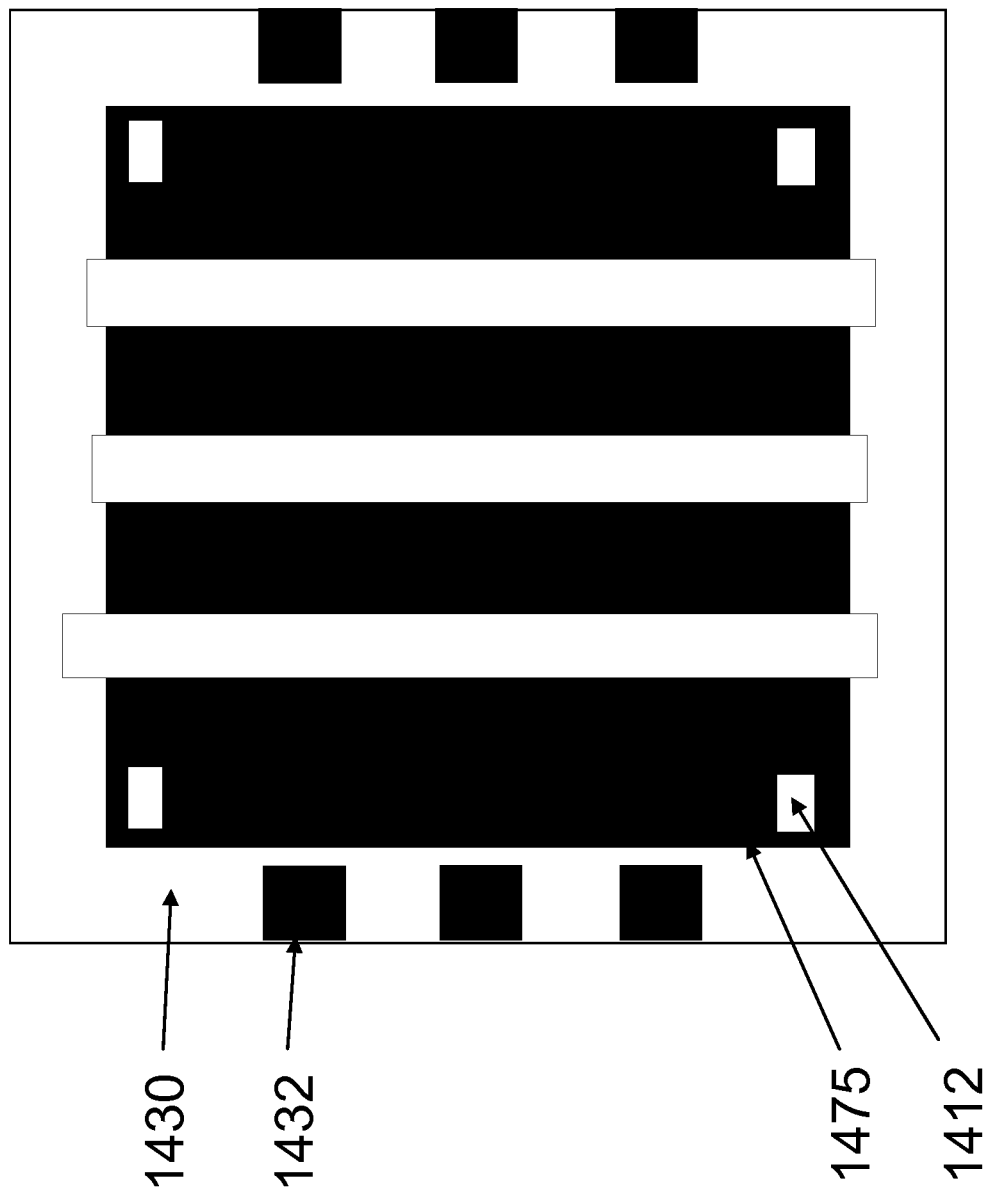
FIG. 14 is a top view diagram of FIG. 13.

FIG. 14 is a diagram of a top view of FIG. 13 illustrating some key constituents such as patterned assembly substrate 1430, components 1412 on assembly substrate 1430, epitaxial film 1475, and patterned layers or devices 1432 on the epitaxial film 1475.

Other examples will be apparent to those skilled in the art and it is expected that the particular components and configuration will vary substantially from application to application depending on performance requirements, cost constraints, etc. Moreover while certain current conventional examples of such components have been described, it will be understood that the present invention can be used with other variants, advances, etc. of such components which are not yet well known and/or undiscovered. For illustrative purposes the present diagrams and discussion is simplified and skilled artisans will appreciate that other components could be employed in deployed application.

Note that the size, shape and configuration of the components is merely illustrative, and no assumptions or limitations should be drawn from these specific depictions. Accordingly the present disclosure will be understood by skilled artisans to describe and enable a number of such variants as well.

What is claimed is:

1. A method of transferring an epitaxial thin film comprising:
providing a first frame portion with a body adapted to hold an assembly substrate;
wherein said assembly substrate includes a plurality of openings adapted to retain an epitaxial layer, and said plurality of openings extend from a top surface of said assembly substrate to a bottom surface thereof;
providing a second base portion adapted to hold a seed substrate in fixed contact with said assembly substrate;
wherein said seed substrate can be used for growing said epitaxial layer within said assembly substrate from a liquid phase epitaxial material, and such that said epitaxial layer contacts said seed substrate within said plurality of openings;
controllably separating said first frame portion and said second base portion so as to cause a separation of said epitaxial layer from said seed substrate;
wherein said epitaxial layer can be transferred as a distinct layer from said seed substrate.

2. The method of claim 1, wherein said epitaxial layer can be grown laterally across a top surface of said assembly substrate.

3. The method of claim 1, further including a step: processing said assembly substrate and epitaxial layer as an integrated epitaxial packaged structure within a semiconductor processing apparatus to form active devices on said assembly substrate and/or said epitaxial layer.

4. The method of claim 1 wherein said epitaxial layer includes a graded composition throughout a thickness direction of said assembly substrate.

5. The method of claim 1 wherein said liquid phase epitaxial material is adapted with thermal characteristics matching said assembly substrate.

6. The method of claim 1, wherein said separating is achieved at least in part by a shearing action.

7. The method of claim 1, wherein said separating is achieved at least in part by a chemical etchant.

8. The method of claim 1 further including a step: forming one or more second separate thin film epitaxial layers on said epitaxial layer.

9. The method of claim 8 wherein said one or more second separate thin film epitaxial layers and said epitaxial layer include different dopant species.

10. The method of claim 1 further including a step: forming one or more second separate assembly substrates on said epitaxial layer.

11. The method of claim 1 wherein said epitaxial layer has a multidimensional structure including lines and via interconnects.

12. The method of claim 1, wherein said epitaxial layer forms part of a p-n junction.

13. The method of claim 1, wherein said epitaxial layer forms part of an integrated circuit device.

14. The method of claim 1 further including a step of forming a sacrificial layer attached between a bottom surface of said assembly substrate and a surface of a crystalline substrate.

15. The method of claim 14 further including a step of forming a spacer situated adjacent said assembly substrate and above said crystalline substrate.

16. The method of claim 14 wherein said crystalline substrate can be re-used for growing a second epitaxial layer with said assembly substrate after said epitaxial layer is separated.

17. The method of claim 1 further including a step: controlling heating and cooling of said liquid epitaxial material.

18. The method of claim 1 further including a step: controlling a side profile of said openings to be vertical, step recessed or sloped to any desired angle.

19. A method of transferring an epitaxial thin film comprising:
providing a first frame portion with a body adapted to hold an assembly substrate;
wherein said assembly substrate includes a plurality of openings adapted to retain an epitaxial layer, and said plurality of openings extend from a top surface of said assembly substrate to a bottom surface thereof;

providing a second base portion adapted to hold a seed substrate in fixed contact with said assembly substrate;

wherein said seed substrate can be used for growing said epitaxial layer within said assembly substrate from a liquid phase epitaxial material which is temperature controlled such that said epitaxial layer contacts said seed substrate within said plurality of openings and grows from a bottom portion upwards;

controllably separating said first frame portion and said second base portion, including with a heating process which is just below a re-melting temperature of the bulk of said epitaxial layer, so as to cause a separation of said epitaxial layer from said seed substrate;

wherein said epitaxial layer can be transferred as a distinct layer from said seed substrate.

20. The method of claim 19 wherein a constant temperature lower than a melt temperature of said liquid phase epitaxial material is maintained at an interface to said seed substrate so that said liquid phase epitaxial material precipitates and grows epitaxially on said seed substrate.

21. The method of claim 19 wherein said assembly substrate, said seed substrate and a melt situate are independently temperature controlled.

22. The method of claim 21 wherein said assembly substrate, said seed substrate and a melt situate are controlled to have a temperature at or slightly above a bulk melting temperature of said liquid phase epitaxial material during a first phase of said growing of said epitaxial layer.

23. The method of claim 22 wherein said assembly substrate, said seed substrate and a melt situate holding said liquid phase epitaxial material are slowly cooled to have a temperature at or slightly below a super-cooling point of said liquid phase epitaxial material during a second phase of said growing of said epitaxial layer.

24. The method of claim 23 wherein said assembly substrate and said seed substrate are further cooled to an ambient temperature after said separation during a fourth phase of said growing of said epitaxial layer.

25. The method of claim 22 wherein said separation is achieved during a third phase of said growing of said epitaxial layer and said re-melting temperature is controlled by one or more of: 1) one or more heating elements embedded inside or as part of said second base portion or said first frame portion; 2) a heat lamp inside or under said second base portion; 3) an RF induction heated system applied to said second base portion; 4) a meshed heating element placed on top of said seed substrate.

26. The method of claim 19 wherein said epitaxial layer includes a graded composition throughout a thickness direction of said assembly substrate.

27. The method of claim 19 wherein said epitaxial layer has a multidimensional structure including lines and via interconnects.

28. The method of claim 19 wherein said seed substrate can be re-used for growing a second epitaxial layer with said assembly substrate after said epitaxial layer is separated.

29. The method of claim 19 further including a step: controlling a side profile of said openings to be vertical, step recessed or sloped to any desired angle.

* * * * *